(12) United States Patent
Kuttner

(10) Patent No.: US 6,559,785 B2
(45) Date of Patent: May 6, 2003

(54) DIGITAL/ANALOG CONVERTER

(75) Inventor: Franz Kuttner, St. Ulrich (AT)

(73) Assignee: Infineon Technologies, AG, Munich (DE)

( * ) Notice: Subject to any disclaimer, the term of this patent is extended or adjusted under 35 U.S.C. 154(b) by 0 days.

(21) Appl. No.: 10/002,334

(22) Filed: Oct. 24, 2001

(65) Prior Publication Data
US 2002/0121996 A1 Sep. 5, 2002

(30) Foreign Application Priority Data

Oct. 25, 2000 (DE) .......................................... 100 52 944

(51) Int. Cl.$^7$ ................................................. H03M 1/12
(52) U.S. Cl. ....................................... 341/155; 341/153
(58) Field of Search ................................ 341/155, 153, 341/154, 156, 150

(56) References Cited

U.S. PATENT DOCUMENTS 4,910,514 A * 3/1990 Irmer et al. ..................... 341/64
6,163,283 A * 12/2000 Schofield ..................... 341/150

* cited by examiner

Primary Examiner—Michael Tokar
Assistant Examiner—Joseph J Lauture
(74) Attorney, Agent, or Firm—Jenkins & Wilson, P.A.

(57) ABSTRACT

Digital/analog converter for converting a binary coded data word into an analog output signal, having a capacitor cell Matrix (9) comprising capacitor cells ($13_{ij}$) which are arranged in matrix form in columns and rows and are driven by thermometer-coded control signals via control lines; a first coding device (6) for recoding the n more significant data bits of the data word D to be converted into a thermometer-coded column control signal which has a width of $2^n$ bits and is applied to the capacitor cell matrix (9) via column control lines (8), a second coding device (11) for recoding the m less significant data bits of the data word D to be converted into a thermometer-coded row control signal which has a width of $2^m$ bits and is applied to the capacitor cell matrix (9) via row control lines (12), each capacitor cell ($13_{ij}$) of the capacitor cell matrix (9) in each cast having an associated local decoding circuit ($19_{ij}$) which drives switches (34, 35, 36, 37) in a manner dependent on the thermometer-coded row control signal and the thermometer-coded column control signal, which switches through-connect at least one capacitor (30, 31) contained in the capacitor cell ($13_{ij}$) to different reference voltages ($V_p$, $V_n$).

15 Claims, 5 Drawing Sheets

DIGITAL/ANALOG CONVERTER

DESCRIPTION

1. Technical Field

The invention relates to a digital/analog converter with thermometer code driving for converting a binary coded data word into an analog output signal.

2. Related Art

A digital/analog converter converts a digital value into a voltage proportional thereto. In many digital/analog converters, the conversion of a digital value into a voltage proportional thereto is effected by summation and currents which are generated by current sources.

Whereas digital/analog converters which use current sources for generating the analog output voltage operate with a thermometer code, in digital/analog converters which use capacitor networks or a capacitor matrix for quantizing the analog value, binary coded control signals are used for driving the capacitor network. The reason for this is that, given a data word width n of the digital value D to be converted, $2^n$ capacitors have to be driven when thermometer-coded control signals are used, whereas only n capacitors have to be driven in the case of binary-thermometer-coded control signals. The $2^n$ capacitors of a capacitor network which is driven with thermometer-coded control signals are driven by a corresponding number of control lines. The control lines are capacitively coupled to one another, with the result that the capacitances of the capacitors within the capacitor network are altered by the coupling capacitance on the control lines and, consequently, the voltage result is corrupted. The higher the number of required control lines, the greater are the parasitic coupling capacitances between the control lines and the associated signal corruptions on the output signal of the digital/analog converter. Digital/analog converters which use binary for driving the capacitor network have the disadvantage, however, that the differential nonlinearity DNL and the characteristic curve deviations TUE from the ideal stepped converter curve of the digital/analog converter are relatively high on account of matching errors or deviations in the capacitance of the fabricated capacitors from the ideally prescribed capacitance.

FIG. 1a shows the deviation of the characteristic curve from the ideal stepped converter characteristic curve in the case of a conventional 8-bit digital/analog converter, the characteristic curve deviation TUE (Total Unadjusted Error) being normalized to the least significant bit LSB of the digital value to be converted.

FIG. 1b shows the associated differential nonlinearity DNL of a conventional digital/analog converter.

As can be gathered from FIGS. 1a, 1b, a major deviation from the ideal converter characteristic curve occurs in the middle of the converter characteristic curve of the conventional digital/analog converter with capacitance network which is driven with binary coded control signals. In the case of the 8-bit digital/analog converter, at the transition from the digital value 127 (0111111) to the digital value 128 (1000000), the capacitor having the largest capacitance, which corresponds to the sum of all the other capacitances, is connected in, while the remaining capacitors having low capacitances are disconnected, with the result that matching errors have a pronounced effect.

SUMMARY OF THE INVENTION

The object of the present invention, therefore, is to provide a digital/analog converter which has a minimal differential nonlinearity DNL.

This object is achieved according to the invention by means of a digital/analog converter having the features specified in patent claim 1.

The invention provides a digital/analog converter for converting a binary coded data word into an analog output signal, having: a capacitor cell matrix comprising capacitor cells which are arranged in matrix form in columns and rows and are driven by thermometer-coded control signals via control lines, a first coding device for recoding the n more significant data bits of the data word to be converted into a thermometer-coded column control signal which has a width of $2^n$ bite and is applied to the capacitor cell matrix via column control lines, a second coding device for recoding the m less significant data bits of the data word to be converted into a thermometer-coded row control signal which has a width of $2^m$ bits and is applied to the capacitor cell matrix via row control lines, each capacitor cell in each case having an associated local decoding circuit which drives switches of the capacitor cell, in a manner dependent on the thermometer-coded row control signal and the thermometer-coded column control signal, which switches through-connect at least one capacitor contained in the capacitor cell to different reference voltages.

Through the use of thermometer-coded control signals, the capacitors of the capacitor cell matrix are driven linearly, i.e. an additional capacitor cell of the capacitor cell matrix is activated at the transition from one digital value to the next digital value.

The local decoding circuit of the capacitor cell arranged in the i-th column and the j-th row preferably has a first logic circuit for logic NAND combination of the signal present on the i-th column control line and the signal present on the j-th row control line, a second logic circuit for logic inversion of the signal present on the i-1-th column control line, and a third logic circuit for logic NAND combination of the first logic circuit and the second logic circuit to form a local control signal for the switches contained in the capacitor cell.

The capacitor cells of the capacitor tell matrix are preferably of differential construction.

In this case, each capacitor cell preferably has two capacitors having the same capacitance, which can be respectively Connected via two associated switches to a positive reference voltage or a negative reference voltage.

The local decoding circuit of a capacitor cell is preferably likewise of differential construction.

In this case, the differentially constructed local decoding circuit preferably contains a first decoding device, which drives the switches of the first capacitor of the differentially constructed capacitor cell in a manner dependent on the thermometer-coded control signals present, and a second decoding device, which drive the switches of the second capacitor of the differentially constructed capacitor cell in a manner dependent on the inverted thermometer-coded control signals present.

The control lines are preferably likewise routed differentially, i.e. when a control line undergoes transition from a logic low value to a logic high value, the adjacent control line undergoes transition from a logic high value to a logic low value.

This affords the particular advantage that instances of capacitive coupling-in on account of coupling capacitances between the control lines are compensated.

The two capacitors of the differentially constructed capacitor cell in each case have a first terminal, which is connected to two controllable switches, for connection of the compactor to a positive and a negative reference voltage, and a second terminal, which is connected to a common potential node of all the capacitor cells.

The common potential node is preferably connected to a signal output of the digital/analog converter for outputting the analog output signal.

The local decoding circuit is preferably supplied with a supply voltage via a signal level converter circuit for increasing the voltage swing at the capacitors.

The logic circuits of the local decoding circuit are preferably constructed using MOSFET transistors.

The switches of the capacitor cells are preferably likewise MOSFET transistors.

The capacitor cells are preferably fabricated using CMOS technology.

In a particularly preferred embodiment, the capacitor cells are of multilayer construction, the control lines and the local decoding circuit of a capacitor cell being arranged below the associated capacitors of the capacitor cell.

In a particular preferred embodiment, the differentially constructed capacitor cells of the capacitor cell matrix are of multilayer construction with five metal layers, the local decoding circuits being arranged below the firs; metal layer in a semiconductor substrate, the row control lines being formed by the first metal layer, the column control lines being formed by the second metal layer, the first capacitors of the capacitor cells being formed by a dielectric located between the third and fourth metal layers, and the second capacitors of the capacitor cells being formed by a dielectric located between the fourth and fifth metal layers.

The multilayer construction of the capacitor cells leads to a considerable saving of area when the digital/analog converter according to the invention is integrated on a chip, and thus to a considerable reduction in the fabrication costs

BRIEF DESCRIPTION OF THE DRAWINGS

Preferred embodiments of the digital/analog converter according to the invention are described below with reference to the accompanying figures in order to elucidate features that are essential to the invention.

In the figures.

DETAILED DESCRIPTION OF THE INVENTION

Figure 1A:
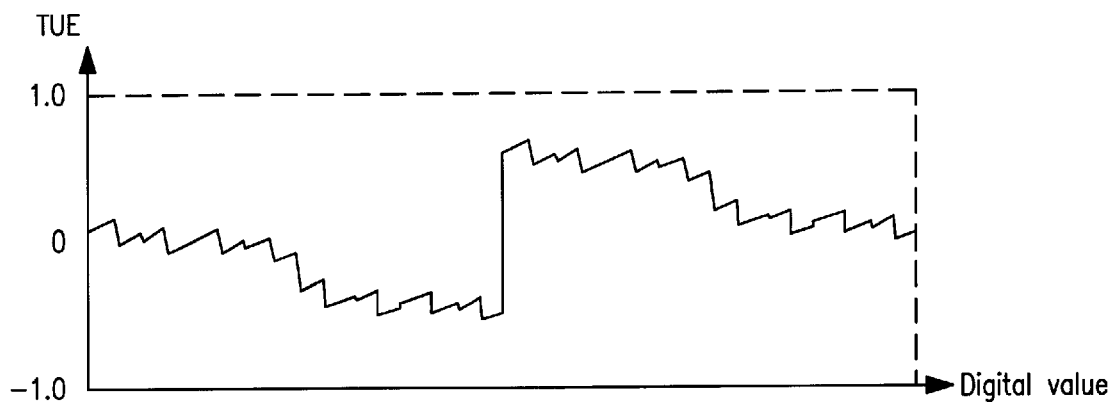
FIG. 1a, 1b show the deviation from the ideal staircase-shaped converter characteristic curve in the case of a conventional digital/analog converter whose capacitor network is driven with binary coded control signals.
Figure 1B:
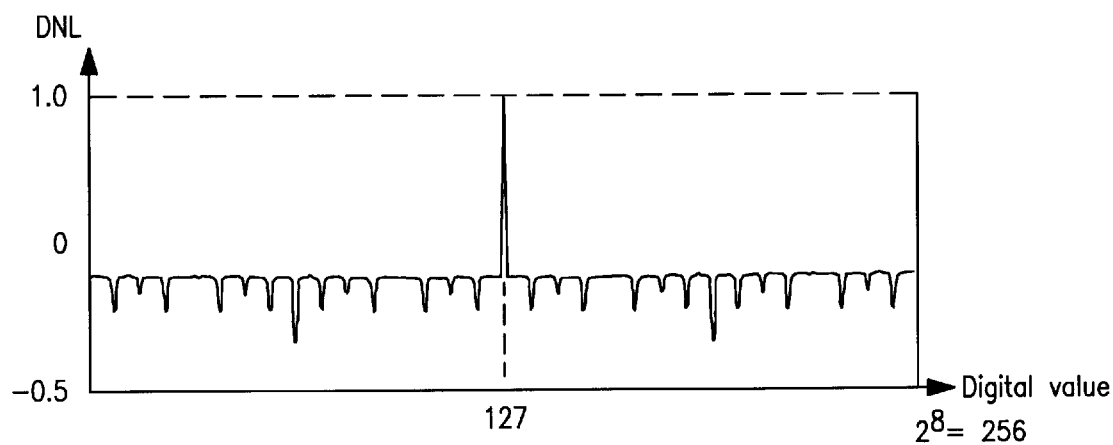
Figure 2:
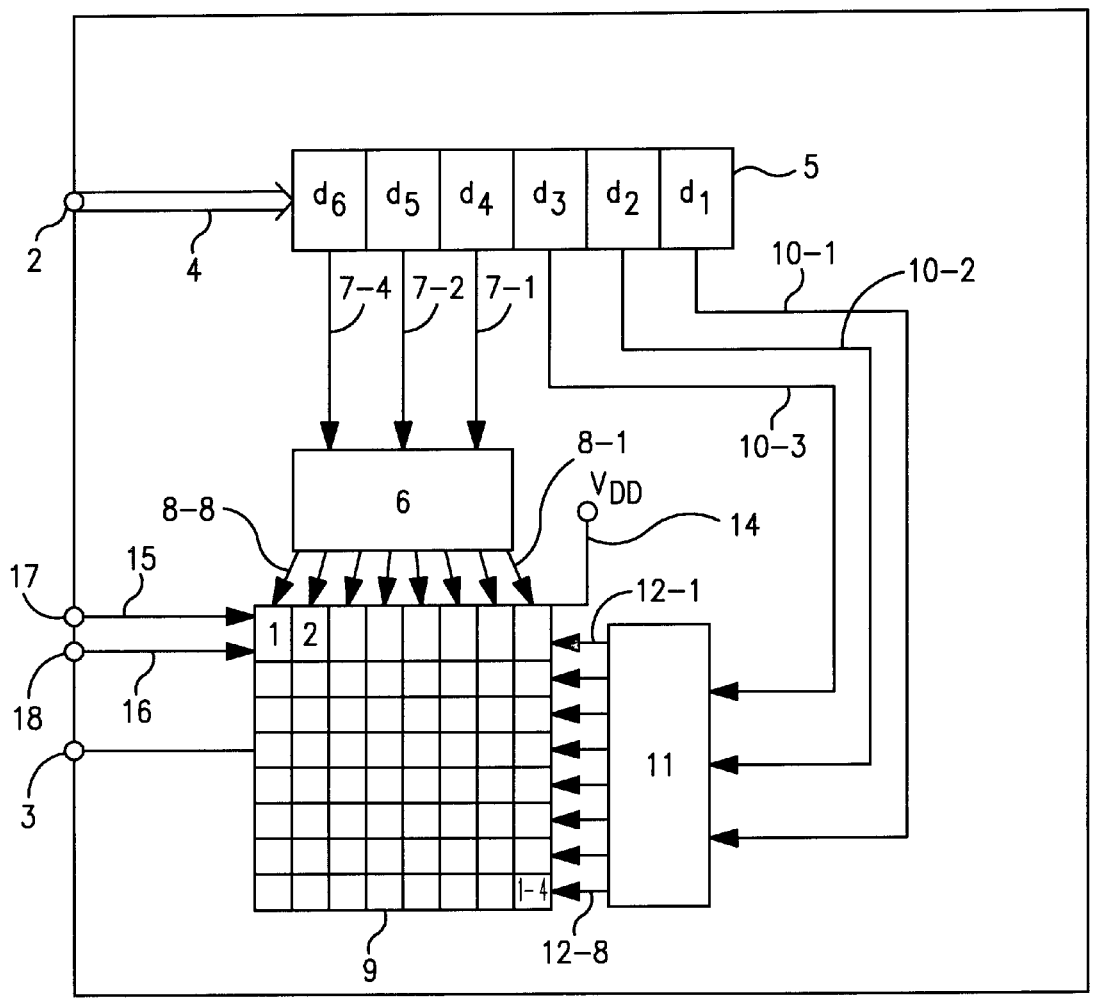
FIG. 2 shows a block diagram of a digital/analog converter according to the invention with thermometer-coded control signals for driving the capacitor network.

As can be seen from FIG. 2, the digital/analog converter 1 according to the invention has a digital signal input 2 and an analog signal output 3. A data word having a width of n+m bit is written to a buffer store 5 via the digital signal input 2, via data lines 4. The digital data word D to be converted comprises 6 bits in the example shown in FIG. 2.

The digital/analog converter 1 contains a first coding device 6, which contains the n more significant data bits of the data word D to be converted and recodes them into a thermometer-coded column control signal which has a width of $2^n$ bits and is applied to a capacitor cell matrix 9 via column control lines 8.

The less significant m data bits d of the digital data word D to be converted are applied to a second coding device 11 via m data lines 10, which coding device recodes the m less significant data bits of the data word D to be converted into a thermometer-coded row control signal which has a width of $2^n$ bits and is applied to the capacitor cell matrix 9 via $2^m$ row control lines 12.

In the exemplary embodiment illustrated in FIG. 2, the number m of less significant data bits is three and the number n of more significant data bits is likewise three, with the result that the capacitor cell matrix 9 is driven via eight column control lines 8 and via eight row control lines 12. The capacitor tell matrix 9 contains capacitor cells $13_{ij}$ arranged in matrix form in eight columns and eight rows. In the exemplary embodiment illustrated in FIG. 2, the capacitor cell matrix 9 thus contains 64 capacitor cells 13.

The capacitor cell matrix 9 is supplied with voltage via a supply voltage line 14 with a supply voltage VDD. The capacitor cells is contained in the capacitor cell matrix 9 receive reference voltages $V_p$ and $V_n$ via lines 15, 16, which reference voltages are applied To reference voltage terminals 17, 18 of the digital/analog converter 1.

Figure 3:
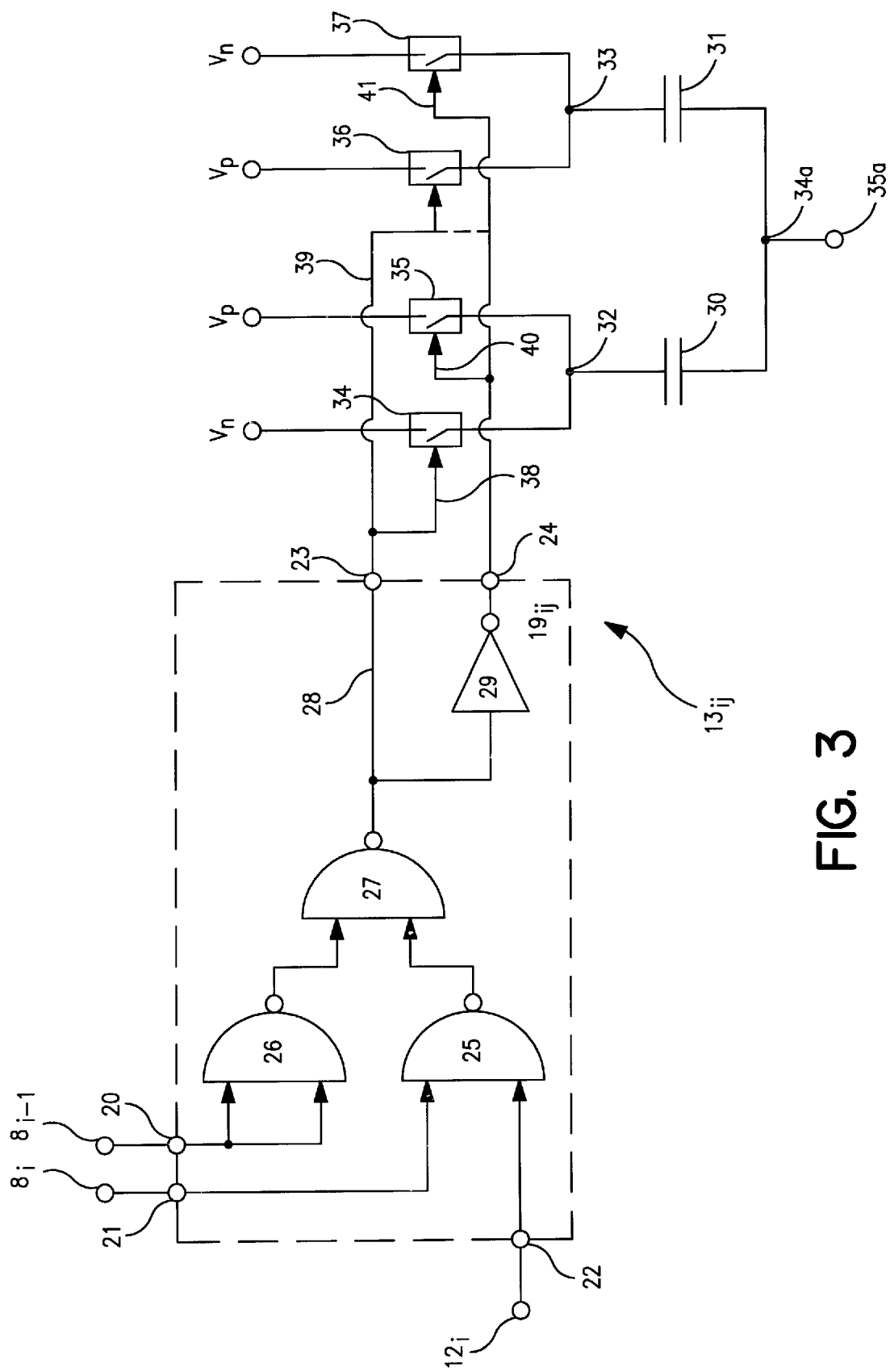
FIG. 3 shows a circuit diagram of a capacitor cell of he digital/analog converter according to the invention.

FIG. 3 shows the construction of a capacitor cell 13 contained in the capacitor cell matrix 5 according to the invention The capacitor cell 13 contains a local decoder 19, which, via control terminals 20, 21, 22, receives control signals from the coding devices 6, 11 via the column control lines 8 and the row control lines 12 and decodes them The local decoding circuit $19_{ij}$ contained in the capacitor cell $13_{ij}$ furthermore has outputs 23, 24 for driving switches. In the embodiment shown in FIG. 3, the local decoding circuit $19_{ij}$ contains a first logic circuit 25 for logic NAND combination of the signal present on the i-th column control line 2, and the signal present on the j-th row control line 12j. The local decoding circuit $19_{ij}$ furthermore contains a second logic circuit 26 for logic inversion of the control signal present on the i-1-th column control line $8_{i-1}$, the signals output by the first and second logic circuits being logically NAND combined by a third logic circuit 27. The output signal of the third logic circuit 27 is output, via a line 28, directly to the control output 23 for the local decoding circuit 19 or, having been inverted by an inverter circuit 29, to a second control output 24 of the local decoding circuit 19. The three logic circuits 25, 26, 27 of the local decoding circuit 19 are formed by NAND gates in the embodiment shown in FIG. 3.

In addition to the local decoding circuit 19, the capacitor cell 13 has two capacitors 30, 31 having the same capacitance. The two capacitors 30, 31 in each case have a first terminal 32, 33 and a common second terminal 34a connected to a common potential node 35a of the capacitor cell matrix 9. All the capacitors of the capacitor cell matrix 9 are connected to the potential node 35a of the capacitor cell matrix 9.

The first capacitor 30 of the capacitor cell 13 can be connected to a negative reference voltage $V_n$ via a controllable switch 34 and to a positive reference voltage $V_p$ via a controllable switch 35. The second capacitor 31 of the capacitor cell 13 can be connected to the positive reference voltage $V_p$ via a controllable switch 36 and to the negative reference voltage $V_n$ via a controllable switch 37.

The switches 34, 36 are driven by the control output 23 of the local decoding circuit 19 via control lines 38, 39. The switches 35, 37 are driven by the second control output 24 of the local decoding circuit 19 via control lines 40, 41. The two capacitors 30, 31 are connected to opposite reference voltages $V_p$, $V_n$ by the local decoding circuit 19.

Figure 4:
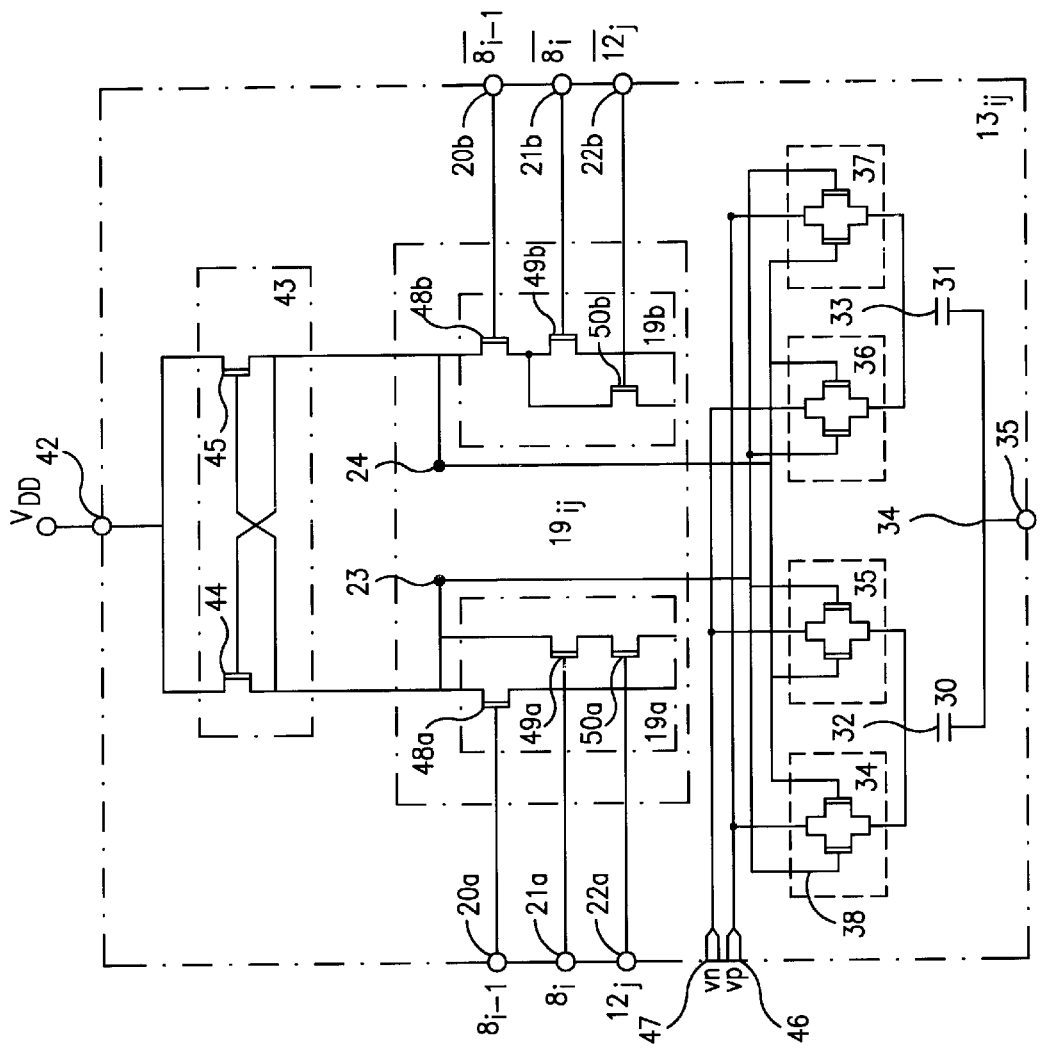
FIG. 4 shows a differentially constructed capacitor cell according to the invention.

FIG. 4 shows a preferred embodiment of a capacitor cell $13_{ij}$ contained in the capacitor tell matrix 9 according to the invention.

The capacitor cell $13_{ij}$ illustrated in FIG. 4 is of fully differential construction. In this case, the capacitor cell is supplied with a supply voltage $V_{DD}$ via a supply voltage terminal 42. The capacitor cell contains a level converter circuit 43, which hag two PMOS field-effect transistors 44, 45 in the embodiment shown in FIG. 4. The local decoding circuit $19_{ij}$ of the capacitor cell $13_{ij}$ is likewise of fully differential construction and contains a first decoding device 19a and a second decoding device 19b.

The first decoding device 19a controls the switches 34, 35, which are connected to the first capacitor 30 of the differentially constructed capacitor cell 13, in a in a manner dependent on the thermometer-coded control signals which are present at the control signal terminals 20a, 21a, 22a, and originate from the coding devices 6, 11.

The second decoding device 19b controls the switches 36, 37, which are connected to the second capacitor 31 of the differentially constructed capacitor cell $13_{ij}$, in a manner dependent on the inverted thermometer-coded control signals which are present at the control terminals 20b, 21b, 22b. The controllable switches 34, 35, 36, 37 are constructed from two complementary MOSFET transistors in the preferred embodiment shown in FIG. 4. In this case, the switch 34 and the switch 37 are connected to a reference voltage terminal 46 of the capacitor cell 13 for application of a negative reference voltage. The controllable switches 35, 36 are connected to a second reference voltage terminal 47 of the capacitor cell 14 for application of a positive reference voltage $V_p$.

The decoding devices 19a, 19b of the differentially constructed local decoding circuit 19 each have three MOS field-effect transistors 48, 49, 50. The signal present at the control input 20a, or the signal output by the coding device 6 via the i-1-th column control line, is inverted by the NMOS field-effect transistor 48a. The control signals of the i-th column control line and of the j-th row control line 12 which are present at the control terminals 21, 22 are logically NAND-combined with one another by the two field-effect transistors 49a, 50a.

The column control lines e and the row control lines 12 are likewise of differential construction, i.e. when the control line 8 undergoes transition from a logic low value 0 to a logic high value 1, the complementary line $\overline{8_i}$ undergoes transition from the logic value 1 to the logic value 0. Instances of capacitive coupling-in are thereby compensated.

The embodiment shown in FIG. 4 has the advantage, on account of the level converter circuit 43, that the voltage swing on the control lines 8, 12 can be smaller than the voltage swings on the capacitors 30, 31 of the capacitor cell 13. The coding circuit 19 is controlled for example by control signals which have a voltage swing of 1.8 volts, while the capacitors 30, 31 can be charged with a voltage swing—corresponding to supply voltage $V_{DD}$—of 3.3 volts, for example.

Figure 5:
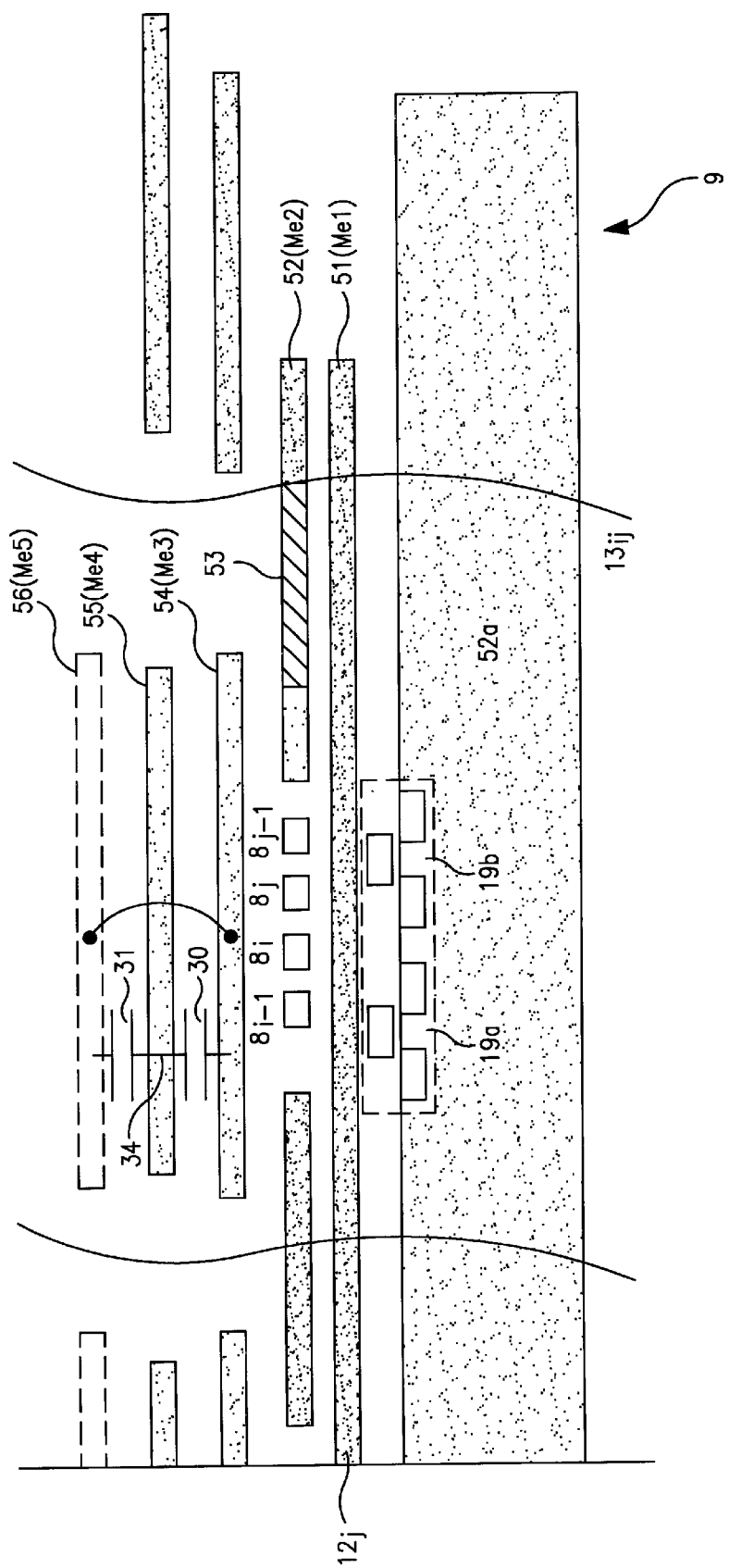
FIG. 5 shows a sectional view through a capacitor cell of multilayer construction according to the invention.

The capacitor cells 13 of the capacitor cell matrix 9 within the digital/analog converter according to the invention are preferably fabricated using CMOS technology. FIG. 5 shows a diagrammatic sectional view through a capacitor cell matrix 9 with a capacitor cell 13 contained therein. In this case, the capacitor cell is of multilayer construction, the control lines and SO the decoding circuit 15 being arranged below the integrated capacitors 30, 31 of the capacitor cell 13. The MOSFET transistors 48 to 50 of the decoding devices 19a, 19b are arranged below a first metal layer on a semiconductor substrate 52.

The row control lines 12 for driving the decoding devices 19a, 19b are located in the first metal layer 51 in the embodiment shown in FIG. 5.

The column control lines 8 for driving the decoding devices 19a, 19b are located in a second metal layer 52 and run perpendicularly to the row control lines 12. Furthermore, metal shields 53 are provided in the second metal layer 52. The row control lines 12 and the column control lines 8 are connected to the MOSFET transistors of the decoding devices 19a, 19b through contacts or vias.

The first capacitor 30 of the capacitor cell 13 is provided between a third metal layer 54 and a fourth metal layer 55. The second capacitor 31 of the capacitor cell 13 is provided between the fourth metal layer 55 and a fifth metal layer 56.

The capacitors 30, 31 of the capacitor cell 13 are respectively formed by a dielectric provided between the metal layers 54, 55 and a dielectric provided between the metal layers 55, 56.

The arrangement of the local decoding devices 19a, 19b of the local decoding circuit 19 and the arrangement of the control lines 8, 12 below the capacitors 30, 31 leads to a considerable saving of area when the capacitor cells 13 are integrated on the semiconductor substrate 52a, and thus to a reduction of the fabrication costs.

In the digital/analog converter 1 according to the invention, the capacitor cell matrix 9 is driven with two thermometer-coded control signals which are generated by the two coding devices 6, 11. The two coding devices 6, 11 perform a recoding of binary coded data bits of the data word to be converted into a thermometer code, each coding device 6, 11 preferably recoding half of the data bits to be converted. The final coding is effected in the capacitor network 9 by the local decoding circuits 19 contained in the capacitor cells 13. The control lines 8, 12 are of differential construction in order to compensate for instances of capacitive coupling-in.

Owing to the use of thermometer-coded control signals, the differential nonlinearity DNL of the digital/analog converter 1 according to the invention is considerably reduced since, at a transition from one digital value to the next digital value, only one capacitor cell 13 of the capacitor network 9 is switched on or off and, consequently, the effects of matching errors are considerably reduced.

| List of reference symbols | |
|---|---|
| 1 | Digital/analog converter |
| 2 | Digital data input |
| 3 | Analog signal output |
| 4 | Data lines |
| 5 | Buffer store |
| 6 | First coding device |
| 7 | Lines |
| 8 | Column control lines |
| 9 | Capacitor cell matrix |
| 10 | Lines |

-continued

List of reference symbols

| | |
|---|---|
| 11 | Second coding device |
| 12 | Row control lines |
| 13 | Capacitor cell |
| 14 | Voltage supply line |
| 15 | Line |
| 16 | Line |
| 17 | Reference voltage terminal |
| 18 | Reference voltage terminal |
| 19 | Local decoding circuit |
| 20 | Control terminal |
| 21 | Control terminal |
| 22 | Control terminal |
| 23 | Control output |
| 24 | Control output |
| 25 | Logic circuit |
| 26 | Logic circuit |
| 27 | Logic circuit |
| 28 | Line |
| 29 | Inverter |
| 30 | Capacitor |
| 31 | Capacitor |
| 34a | Node |
| 35a | Node |
| 34 | Switch |
| 35 | Switch |
| 36 | Switch |
| 37 | Switch |
| 38 | Control line |
| 39 | Control line |
| 40 | Control line |
| 41 | Control line |
| 42 | Supply voltage terminal |
| 43 | Level converter circuit |
| 44 | PMOS field-effect transistor |
| 45 | PMOS field-effect transistor |
| 46 | Reference voltage terminal |
| 47 | Reference voltage terminal |
| 48 | NMOS field-effect transistor |
| 49 | NMOS field-effect transistor |
| 50 | NMOS field-effect transistor |
| 51 | First metal layer |
| 52 | Second metal layer |
| 52a | Semiconductor substrate |
| 53 | Shields |
| 54 | Third metal layer |
| 55 | Fourth metal layer |
| 56 | Fifth metal layer |

What is claimed is:

1. A digital/analog converter for converting a binary coded data word D into an analog output signal, having:
   a) a capacitor cell matrix comprising capacitor cells which are arranged in matrix form in columns and rows and are driven by control signals via control lines;
   b) a first coding device for recoding n more significant data bits of the data word D to be converted into a column control signal which has a width of $2^n$ bits and is applied to the capacitor cell matrix via column control lines;
   c) a second coding device for recoding m less significant data bits of the data word D to be converted into a row control signal which has a width of $2^m$ bits and is applied to the capacitor cell matrix via row control lines;
   d) each capacitor cell of the capacitor cell matrix in each case having an associated local decoding circuit which drives switches in a manner dependent on the row control signal and the column control signal, which switches through-connect at least one capacitor contained in the capacitor cell to different reference voltages ($V_p$, $V_n$);
   e) wherein the capacitor cell is of multilayer construction; and
   f) wherein the control lines and the local decoding circuits being arranged below the capacitors.

2. The digital/analog converter as claimed in claim 1, wherein the capacitor cells of the capacitor cell matrix are of differential construction.

3. The digital/analog converter as claimed in claim 1, wherein the capacitor cell is of multilayer construction with five metal layers, the local decoding circuit being arranged below the first metal layer in a semiconductor substrate, the row control lines are located in the first metal layer, the column control lines are located in a second metal layer, the first capacitor of the capacitor cell being formed by a dielectric located between a third metal layer and a fourth metal layer, and the second capacitor of the capacitor cell being formed by a dielectric located between the fourth metal layer and a fifth metal layer.

4. The digital/analog converter as claimed in claim 1, wherein the capacitor cell has two capacitors having the same capacitance, which can be respectively connected via two associated switches to a positive reference voltage ($V_p$) or a negative reference voltage ($V_n$).

5. The digital/analog converter as claimed in claim 1, wherein the local decoding circuit is of differential construction.

6. The digital/analog converter as claimed in claim 1, wherein the local decoding circuit has a first decoding device, which drives the switches of the first capacitor of the capacitor cell in a manner dependent on the control signals present, and a second decoding device, which drives the switches of the second capacitor of the capacitor cell in a manner dependent on the inverted control signals present.

7. The digital/analog converter as claimed in claim 1, wherein the capacitors of the capacitor cells in each case have a first terminal, which is connected to two controllable switches, for connection to a positive and a negative reference voltage, and a second terminal, which is connected to a common potential node of the capacitor cell matrix.

8. The digital/analog converter as claimed in claim 7, wherein the common potential node of the capacitor cell matrix is connected to a signal output of the digital/analog converter for outputting the analog output signal.

9. The digital/analog converter as claimed in claim 1, wherein the local decoding circuit is supplied with a supply voltage ($V_{DD}$) via a level converter circuit for increasing the voltage swing at the capacitors.

10. The digital/analog converter as claimed in claim 1, wherein the control lines are of differential construction.

11. The digital/analog converter as claimed in claim 1, wherein the logic circuits of the local decoding circuit are constructed from MOSFET transistors.

12. The digital/analog converter as claimed in claim 1, wherein the switches of the capacitor cells are constructed from MOSFET transistors.

13. The digital/analog converter as claimed in claim 1, wherein the capacitor cells are fabricated using CMOS technology.

14. The digital/analog converter as claimed in claim 1, wherein the local decoding circuit of the capacitor cell arranged in the i-th column and the j-th row has a first logic circuit for logic NAND combination of the signal present on the i-th column control line and the signal present on the j-th row control line, a second logic circuit for logic inversion of the signal present on the i-1-th column control line, and a third logic circuit for logic NAND combination of the output signals of the first logic circuit and of the second logic circuit to form a local control signal for the switches of the capacitor cell.

15. The digital/analog converter as claimed in claim 1, wherein the column control signal and the row control signal are thermometer-coded signals.

* * * * *